United States Patent
Kubota et al.

(10) Patent No.: US 8,274,134 B2
(45) Date of Patent: Sep. 25, 2012

(54) SEMICONDUCTOR DEVICE WITH ELECTRIC FUSE HAVING INTERCONNECTS AND VIA

(75) Inventors: Yoshitaka Kubota, Kanagawa (JP); Hiromichi Takaoka, Kanagawa (JP); Hiroshi Tsuda, Kanagawa (JP)

(73) Assignee: Renesas Electronics Corporation, Kawasaki-Shi, Kanagawa (JP)

( * ) Notice: Subject to any disclaimer, the term of this patent is extended or adjusted under 35 U.S.C. 154(b) by 146 days.

(21) Appl. No.: 12/588,223

(22) Filed: Oct. 8, 2009

(65) Prior Publication Data
US 2010/0096724 A1 Apr. 22, 2010

(30) Foreign Application Priority Data
Oct. 17, 2008 (JP) ................. 2008/268997

(51) Int. Cl.
*H01L 23/525* (2006.01)
(52) U.S. Cl. ............... 257/529; 257/E23.149
(58) Field of Classification Search .......... 257/E23.149, 257/209, 528–529, 665, E21.159
See application file for complete search history.

(56) References Cited

U.S. PATENT DOCUMENTS

| | | | |
|---|---|---|---|
| 6,661,330 B1 * | 12/2003 | Young ................. | 337/297 |
| 7,378,718 B2 | 5/2008 | Tsutsui | |
| 2007/0069331 A1 * | 3/2007 | Maiz et al. ................ | 257/529 |
| 2007/0262414 A1 * | 11/2007 | Ueda ................. | 257/529 |

FOREIGN PATENT DOCUMENTS

| | | |
|---|---|---|
| CN | 101071802 (A) | 11/2007 |
| JP | 7-122646 | 5/1995 |
| JP | 2006-13338 | 1/2006 |
| JP | 2007-305693 | 11/2007 |

OTHER PUBLICATIONS

Chinese Office Action dated Jun. 5, 2012, with English-language translation.

* cited by examiner

*Primary Examiner* — Victor A Mandala
*Assistant Examiner* — Selim Ahmed
(74) *Attorney, Agent, or Firm* — McGinn IP Law Group, PLLC (57) ABSTRACT

A semiconductor device (200) includes an electric fuse (100) including: an upper layer fuse interconnect (112) formed on a substrate (not shown); a lower layer fuse interconnect (122); and a via (130) which is connected to one end of the upper layer fuse interconnect (112) and connects the upper layer fuse interconnect (112) and the lower layer fuse interconnect (122). The upper fuse interconnect (112) includes a width varying region (118) having a small interconnect width on a side of the one end.

16 Claims, 11 Drawing Sheets

HIGH TEMPERATURE POINT

FIG. 11B

HIGH TEMPERATURE POINT

SEMICONDUCTOR DEVICE WITH ELECTRIC FUSE HAVING INTERCONNECTS AND VIA

BACKGROUND OF THE INVENTION

1. Field of the Invention

The present invention relates to a semiconductor device including an electric fuse.

2. Description of the Related Art

In recent years, there has been proposed a novel method of disconnecting an electric fuse, which is called a crack assist type method. In this new method, the structure of the electric fuse, how to apply a voltage to the electric fuse, and the like are controlled, to thereby forcibly cause a conductive material, which forms the electric fuse as a part thereof, to overflow outwardly, that is, into an insulating film located around the conductive material, during disconnection of the electric fuse. As a result, a movement and supply balance among materials is lost. In this manner, a large disconnection point is formed in another part. Accordingly, the possibility that the disconnected electric fuse is connected again may be greatly reduced, and the disconnection state may be satisfactorily maintained (see, for example, JP 2007-305693 A).

Figure 7:
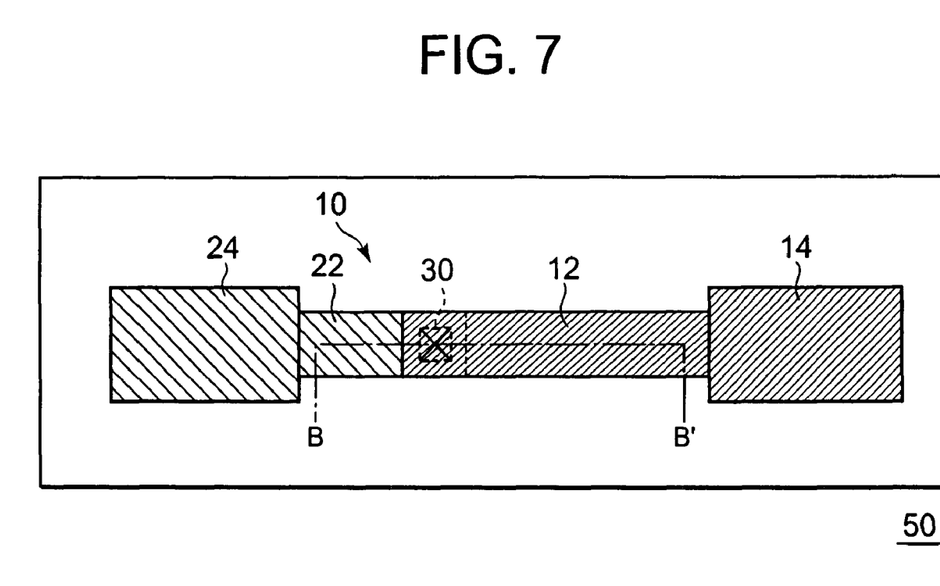
FIG. 7 is a plan view illustrating a structure of a semiconductor device according to a related art.

FIG. 7 is a plan view illustrating a structure of a semiconductor device 50 including an electric fuse 10 that is similar to the electric fuse described in JP 2007-305693 A. The electric fuse 10 includes a terminal 14 and a terminal 24, an upper layer fuse interconnect 12 connected to the terminal 14, a lower layer fuse interconnect 22 connected to the terminal 24, and a via 30 that connects the upper layer fuse interconnect 12 and the lower layer fuse interconnect 22.

Figure 8A:
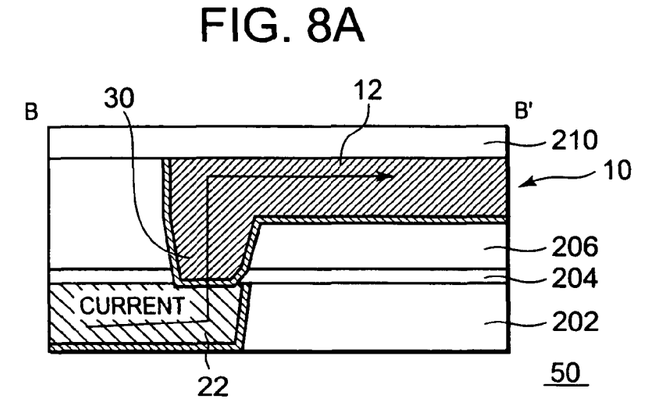
FIGS. 8A to 8C are cross sectional views taken along the line B-B' of FIG. 7.
Figure 8B:
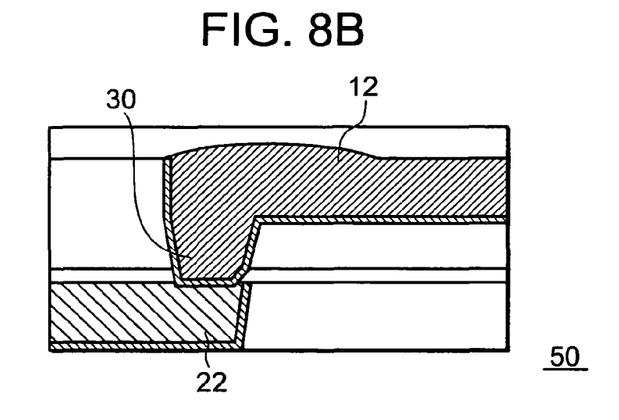
Figure 8C:
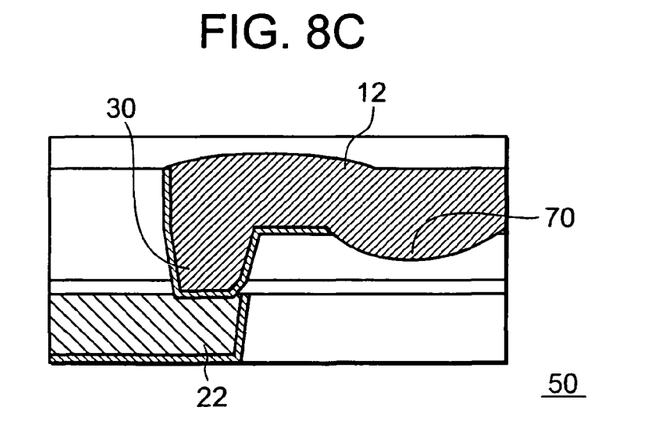

FIGS. 8A to 8C are cross sectional views taken along the line B-B' of FIG. 7. The semiconductor device 50 has a structure in which an interlayer insulating film 202, an etching stopper film 204, an interlayer insulating film 206, and an interlayer insulating film 210 are laminated on a substrate (not shown) in the stated order. The terminal 24 and the lower layer fuse interconnect 22 are formed in the interlayer insulating film 202, whereas the via 30, the upper layer fuse interconnect 12, and the terminal 14 are formed in the interlayer insulating film 206.

In the electric fuse 10 having the above-mentioned structure, when a voltage is applied between the terminal 14 and the terminal 24, a current is caused to flow in a direction from the lower layer fuse interconnect 22 to the upper layer fuse interconnect 12 (FIG. 8A). As a result, the via 30 and the upper layer fuse interconnect 12 are heated. Further, the conductive material such as copper, which forms each of the via 30 and the upper layer fuse interconnect 12, expands. With regard to the via 30, a via diameter thereof expands to be larger than an original via diameter thereof (FIG. 8B). After that, when the expansion of the upper layer fuse interconnect 12 advances to a certain degree, a crack occurs in the interlayer insulating film 206 located around the upper layer fuse interconnect 12. As a result, the conductive material of the upper layer fuse interconnect 12 overflows into the interlayer insulating film 206, to thereby form an overflow portion 70 (FIG. 8C). In a case where the electric fuse 10 is normally disconnected, the conductive material of the via 30 moves along with the overflow of the conductive material of the upper layer fuse interconnect 12, and then a disconnection point is formed in the via 30.

JP 2006-13338 A discloses a fuse element including a first region that is a portion for isolating circuitry, and a second region and a third region that each are in contact with both ends of the first region and have a pattern width larger than that of the first region. In the fuse element, the second region, the first region, and a part of the third region are formed on a thick insulating film, while the remaining part of the third region is formed on a thin insulating film. Heat generated in the fuse element is less likely to be released to a semiconductor substrate through the thick insulating film, but is more likely to be released to the semiconductor substrate through the thin insulating film. The fuse element therefore has a large temperature change and a large temperature gradient. This is intended to facilitate electrical disconnection of the first region.

JP 07-122646 A discloses a semiconductor integrated circuit device having the following structure. That is, a fuse layer including a pair of rectangular contact portions that are linked with each other through tapered portions and a linear portion is formed on a main surface of a semiconductor substrate. An insulating layer is then formed on the fuse layer, and a power supply interconnect connected to the fuse layer through a contact hole is formed on the insulation layer.

According to both the technologies described in JP 2006-13338 A and JP 07-122646 A, a portion having a small width is made to be more easily disconnected.

Meanwhile, the inventor of the present invention has found that the following problem arises when the electric fuse having the structure as described in JP 2007-305693 A is to be disconnected by the crack assist type method.

Figure 9A:
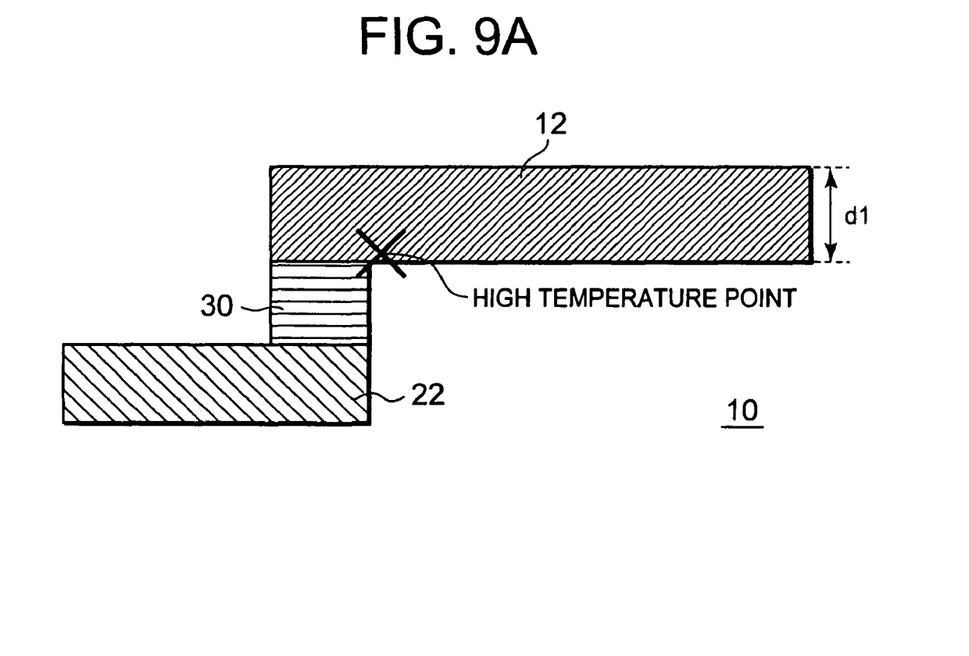
FIGS. 9A and 9B are views for describing a problem of the related art.
Figure 9B:
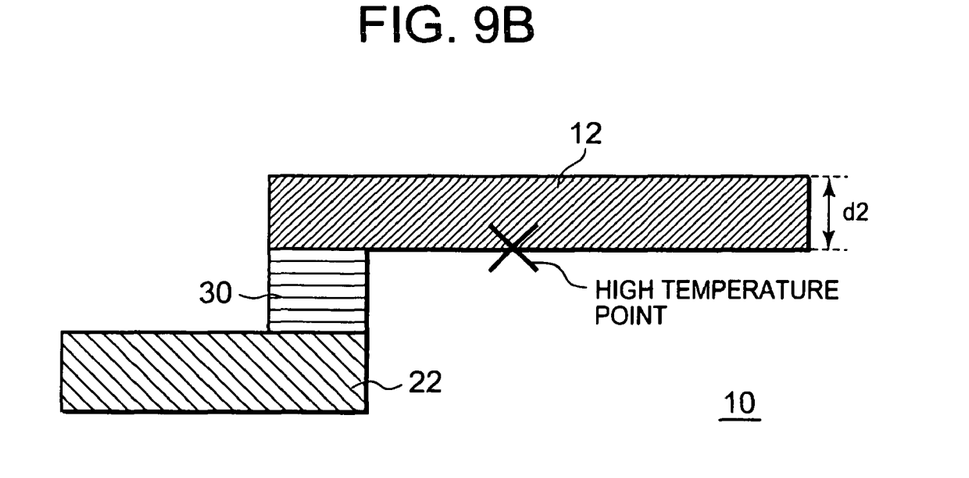

FIGS. 9A and 9B are cross sectional views illustrating the upper layer fuse interconnect 12, the via 30, and the lower layer fuse interconnect 22 included in the electric fuse 10 of FIG. 7 and FIGS. 8A to 8C. In the electric fuse 10 having the structure as illustrated in FIG. 7 and FIGS. 8A to 8C, when a voltage is applied between the terminal 14 and the terminal 24, the terminal 14 and the terminal 24 each having a large area function as a heat sink. Therefore, a point at which the temperature becomes the highest in the electric fuse 10 during the disconnection of the electric fuse 10 depends on a distance from the terminal 14 and a distance from the terminal 24. Further, in structuring the electric fuse 10, a point at which the overflow portion 70 is formed depends on areas or the like of respective structural components. Here, in order that the overflow portion 70 is formed in the upper layer fuse interconnect 12 and that the disconnection point is formed in the via 30, a width and a length of each of the upper layer fuse interconnect 12 and the lower layer fuse interconnect 22 are appropriately adjusted. As a result, a temperature near the disconnection point of the upper layer fuse interconnect 12 from the via 30 may be set to be the highest (FIG. 9A). However, during a manufacture of the semiconductor device 50, there is a case, for example, as illustrated in FIG. 9B in which a film thickness of the upper layer fuse interconnect 12 becomes thinner, that is, becomes not a preset value d1 of FIG. 9A but a value d2 of FIG. 9B (d1>d2) due to manufacturing fluctuations such as fluctuations in film formation or polishing. In such a case, a resistance of the upper layer fuse interconnect 12 changes, with the result that the point at which the temperature becomes the highest during the disconnection shifts to a center part of the upper layer fuse interconnect 12, which is away from the via 30.

Figure 10A:
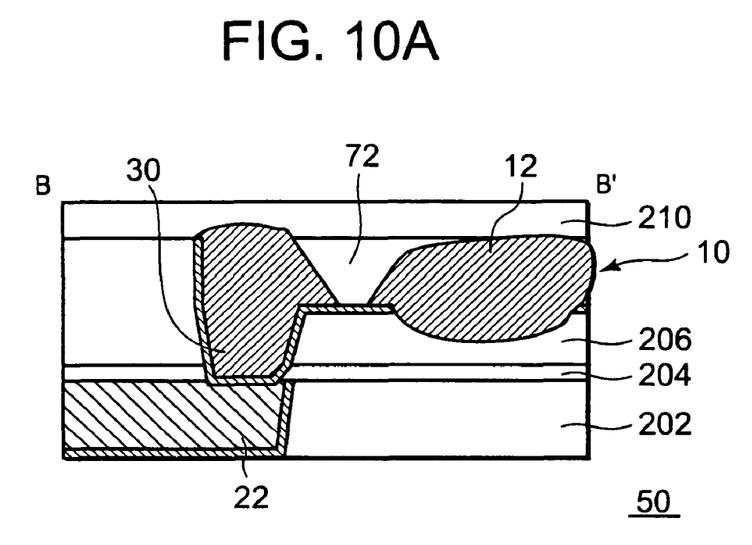
FIGS. 10A and 10B are views for describing the problem of the related art.
Figure 10B:
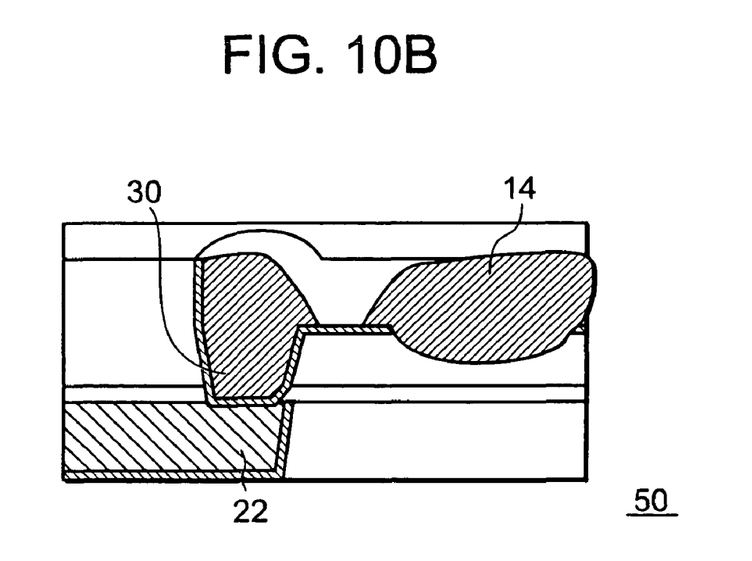

As described above, when the point at which the temperature becomes the highest during the disconnection is away from the via 30 to be too close to the center part of the upper layer fuse interconnect 12, the via 30 is not sufficiently heated. As a result, a disconnection failure that the via 30 is not disconnected occurs. Description is given with reference to FIGS. 10A and 10B. FIGS. 10A and 10B are cross sectional views taken along the line B-B' of FIG. 7, and illustrates steps subsequent to the steps of FIGS. 8A to 8C during the disconnection of the electric fuse 10. When the upper layer fuse interconnect 12 overflows before the conductive material that forms the via 30 is sufficiently heated to be melted enough to be movable, a void is formed in the upper layer fuse interconnect 12, and then a disconnection point 72 is formed in the upper layer fuse interconnect 12 (FIG. 10A). In this case, the conductive material of the via 30 does not move. After that, the conductive material continues to thermally contract until the temperature thereof reaches room temperature, and then solidifies while leaving the disconnection point 72 above the via 30 and inside the upper layer fuse interconnect 12 (FIG. 10B). However, in the structure described above in which the disconnection point 72 is formed in the upper layer fuse interconnect 12, there is a fear that the reconnection occurs in a case where the conductive material coagulates and then deforms due to thermal history thereof in the following assembly process or the like of the semiconductor device 50 or in actual use of the semiconductor device 50 under high temperature.

SUMMARY

According to one aspect of the present invention, there is provided a semiconductor device including:
a substrate; and
an electric fuse including:
a first fuse interconnect formed on the substrate;
a second fuse interconnect formed in a layer different from a layer in which the first fuse interconnect on the substrate is formed; and
a via which is connected to one end of the first fuse interconnect and connects the first fuse interconnect and the second fuse interconnect,
in which the first fuse interconnect includes a width varying region having a small interconnect width on a side of the one end.

Figure 11A:
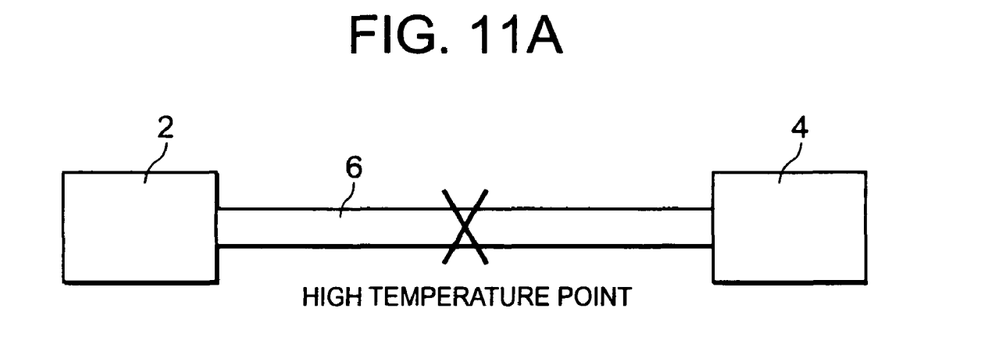
FIGS. 11A and 11B are views for describing a mechanism of the present invention.
Figure 11B:
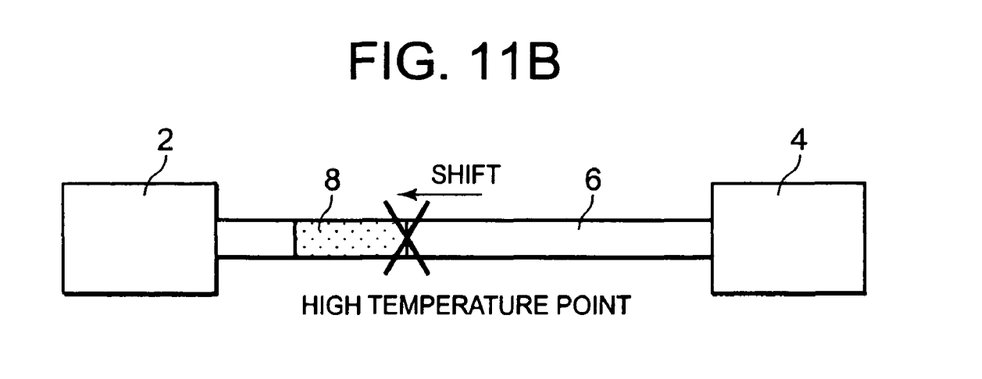

FIGS. 11A and 11B illustrate an electric fuse having a simple structure in which a fuse interconnect 6 is formed between a terminal 2 and a terminal 4. In this electric fuse, when a voltage is applied between the terminal 2 and the terminal 4, the terminal 2 and the terminal 4 each having a large area function as a heat sink. Therefore, the entire fuse interconnect 6 is heated, but a temperature of a center part of the fuse interconnect 6, which is the farthest from the heat sinks, becomes the highest, and thus the fuse interconnect 6 is melted and disconnected at the center part (FIG. 11A). In contrast, when a high resistance portion 8 having a resistance higher than those of other parts is formed in the fuse interconnect 6, the high resistance portion 8 generates more heat than the other parts. As a result, a point at which the temperature becomes the highest shifts from the center part toward the high resistance portion 8 (FIG. 11B). Similarly, in the present invention, a width varying region is formed, to thereby control a portion in which a resistance becomes high to be in a vicinity of the via. In this manner, the position of the point at which the temperature becomes the highest is controlled.

According to this structure, there is adopted a layout in which a resistance of a portion that connects the first fuse interconnect and the via becomes high. Therefore, when a current is caused to flow through the electric fuse, the temperature may be controlled to become high in the portion that connects the first fuse interconnect and the via. Accordingly, for example, even when a film thickness of the first fuse interconnect varies due to manufacturing fluctuations, the influence of the manufacturing fluctuations may be reduced, with the result that a disconnection point may be stably formed in the via.

It should be noted that any combination of the above-mentioned structural components and a replaced expression of the present invention, for example, between a method and a device are to be considered also as aspects of the present invention.

According to the present invention, there may be obtained the electric fuse having a structure in which the disconnection point is controlled irrespective of the manufacturing fluctuations.

BRIEF DESCRIPTION OF THE DRAWINGS

The above and other objects, advantages and features of the present invention will be more apparent from the following description of certain preferred embodiments taken in conjunction with the accompanying drawings, in which.

DETAILED DESCRIPTION OF THE PREFERRED EMBODIMENT

Hereinafter, an embodiment of the present invention is described with reference to the attached drawings. It should be noted that, throughout all the drawings, similar structural components are denoted by similar reference symbols and description thereof is appropriately omitted.

Figure 1:
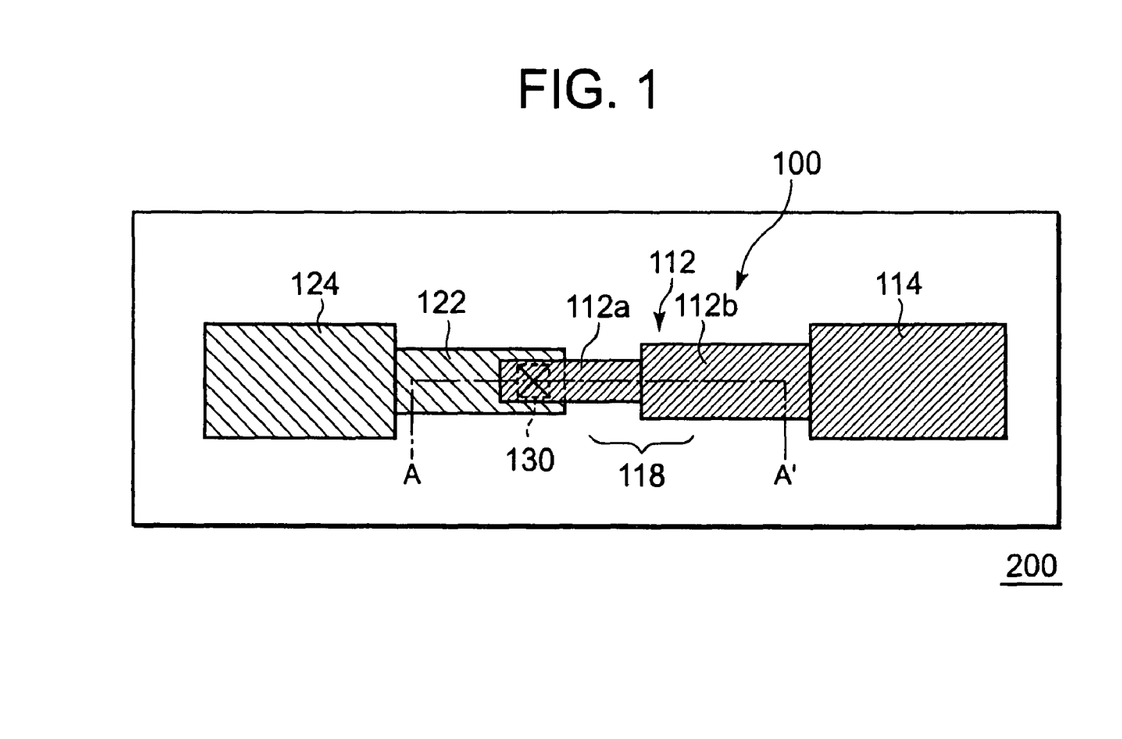
FIG. 1 is a plan view illustrating an example of a structure of a semiconductor device including an electric fuse according to an embodiment of the present invention.

FIG. 1 is a plan view illustrating an example of a structure of a semiconductor device according to this embodiment. FIGS. 2A to 2C and FIGS. 3A to 3C are cross sectional views taken along the line A-A' of FIG. 1.

A semiconductor device 200 includes a substrate (not shown) that is a semiconductor substrate such as a silicon substrate, and an electric fuse 100 formed on the substrate. The electric fuse 100 includes an upper layer fuse interconnect 112 (first fuse interconnect), a lower layer fuse interconnect 122 (second fuse interconnect) formed in a layer different from a layer in which the upper layer fuse interconnect 112 is formed, and a via 130 connected to one end of the upper layer fuse interconnect 112 and to one end of the lower layer fuse interconnect 122. The semiconductor device 200 further includes an upper layer terminal 114, which is formed above the substrate at least in the same layer as the layer in which the upper layer fuse interconnect 112 is formed and is connected to another end of the upper layer fuse interconnect 112, and a lower layer terminal 124, which is formed on the substrate at least in the same layer as the layer in which the lower layer fuse interconnect 122 is formed and is connected to another end of the lower layer fuse interconnect 122.

In this embodiment, the electric fuse 100 is disconnected by a crack assist type method. Specifically, a conductive material that forms the electric fuse 100 overflows from the upper layer fuse interconnect 112 outwardly during the disconnection, to thereby form an overflow portion. The electric fuse 100 may be disconnected by the overflow portion thus formed. In this embodiment, a disconnection point may be formed in the via 130.

In the case where the electric fuse 100 is disconnected by the crack assist type method, Joule heat generated by a current controls the disconnection. Therefore, in order to prevent an interconnect from being inappropriately disconnected at a point other than a point to be disconnected, there is required a structure in which the upper layer terminal 114 and the lower layer terminal 124 located at the point other than the point to be disconnected are not heated even under application of a large current. The upper layer terminal 114 and the lower layer terminal 124 may be, for example, a common interconnect or a pad interconnect for applying a voltage to the electric fuse. Alternatively, the upper layer terminal 114 and the lower layer terminal 124 may be an extraction interconnect connected to the common interconnect or the pad interconnect. In any case, a width of the upper layer terminal 114 and a width of the lower layer terminal 124 in a direction orthogonal to a direction in which a current flows in the electric fuse 100 (hereinafter, simply referred to as interconnect width) may be equal to or larger than a widest portion of the upper layer fuse interconnect 112 and a widest portion of the lower layer fuse interconnect 122. Further, the upper layer terminal 114 and the lower layer terminal 124 may be structured so as not to affect a position of the disconnection point or the like during the disconnection of the electric fuse 100.

In the electric fuse 100 of this embodiment, at which point the temperature is to become the highest and the overflow portion is to be formed when a predetermined voltage is applied between the upper layer terminal 114 and the lower layer terminal 124 may be set by controlling the structure of the upper layer fuse interconnect 112 and the structure of the lower layer fuse interconnect 122. For example, the upper layer terminal 114 and the lower layer terminal 124 each having a large interconnect width function as a heat sink for releasing heat necessary to disconnect the electric fuse 100. Therefore, as a distance from the upper layer terminal 114 and a distance from the lower layer terminal 124 are longer, the temperature may be higher. Further, the point at which the overflow portion is formed during the disconnection of the electric fuse 100 depends on areas or the like of the respective structural components. In this embodiment, in order that the overflow portion is formed in the upper layer fuse interconnect 112 and that the disconnection point is formed in the via 130, the upper layer fuse interconnect 112 is formed so as to have a volume larger than that of the lower layer fuse interconnect 122. Further, in order to increase the distance from the upper layer terminal 114, the upper layer fuse interconnect 112 may be set to be longer than the lower layer fuse interconnect 122. In this way, control may be performed such that the upper layer fuse interconnect 112 expands as the temperature thereof rises to be higher than the temperature of the lower layer fuse interconnect 122 and that the conductive material of the upper layer fuse interconnect 112 overflows.

In addition, in this embodiment, the upper layer fuse interconnect 112 includes a width varying region 118 having a smaller interconnect width at the one end connected to the via 130. In this embodiment, an interconnect width of the width varying region 118 may be reduced in a vicinity of a connection point with the via 130. Further, the width varying region 118 may be formed such that the temperature becomes higher in the vicinity of the connection point of the upper layer fuse interconnect 112 with the via 130 when a voltage is applied to the electric fuse 100. In the example illustrated in FIG. 1, the upper layer fuse interconnect 112 includes a narrow portion 112a connected to the via 130 and a wide portion 112b connected to the upper layer terminal 114. An interconnect width of the narrow portion 112a may be the smallest in the upper layer fuse interconnect 112. Here, the vicinity of the connection point with the via 130 may be on the via 130 side with respect to a center part of a total length of the upper layer fuse interconnect 112. Therefore, the narrow portion 112a may be formed on the via 130 side with respect to the center part of the total length of the upper layer fuse interconnect 112. In addition, the vicinity of the connection point with the via 130 may be on the via 130 side with respect to a center part of a total length of the electric fuse 100 including the upper layer fuse interconnect 112, the via 130, and the lower layer fuse interconnect 122. Therefore, the narrow portion 112a may be formed on the via 130 side with respect to the center part of the total length of the electric fuse 100 including the upper layer fuse interconnect 112, the via 130, and the lower layer fuse interconnect 122.

Owing to the width varying region 118 thus formed, even when a film thickness of the upper layer fuse interconnect 112 changes due to manufacturing fluctuations or the like, a resistance may be always high at the narrow portion 112a in the upper layer fuse interconnect 112. As a result, the point at which the temperature becomes the highest may be controlled to be in the vicinity of the via 130. Here, the interconnect width of the narrow portion 112a may be, for example, equal to or larger than 60 nm and equal to or smaller than 90 nm, and an interconnect width of the wide portion 112b may be, for example, equal to or larger than 80 nm and equal to or smaller than 150 nm (note that the interconnect width of the narrow portion 112a is smaller than the interconnect width of the wide portion 112b in any case).

Figure 2A:
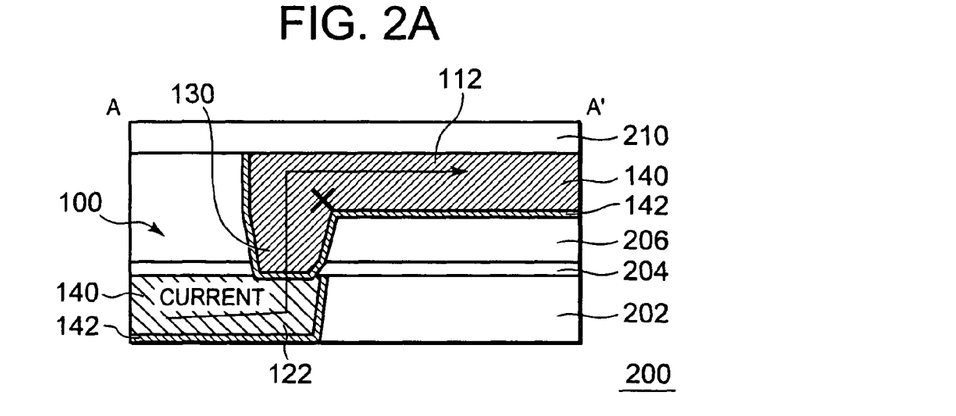
FIGS. 2A to 2C are cross sectional views taken along the line A-A' of FIG. 1.
Figure 2B:
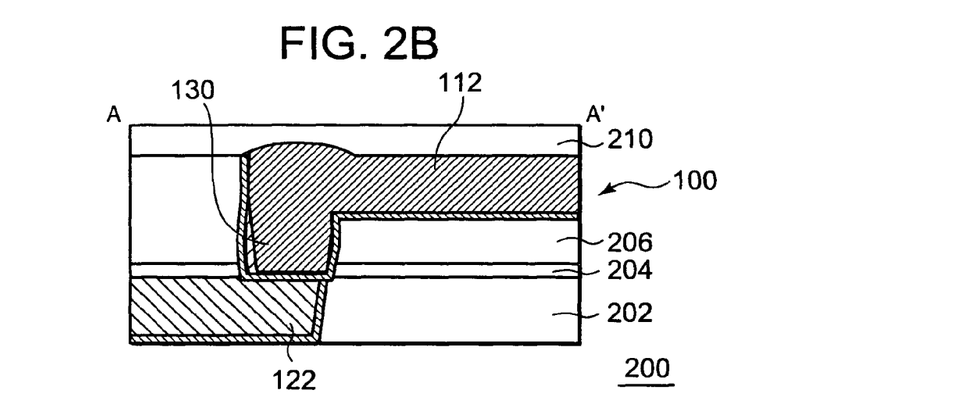
Figure 2C:
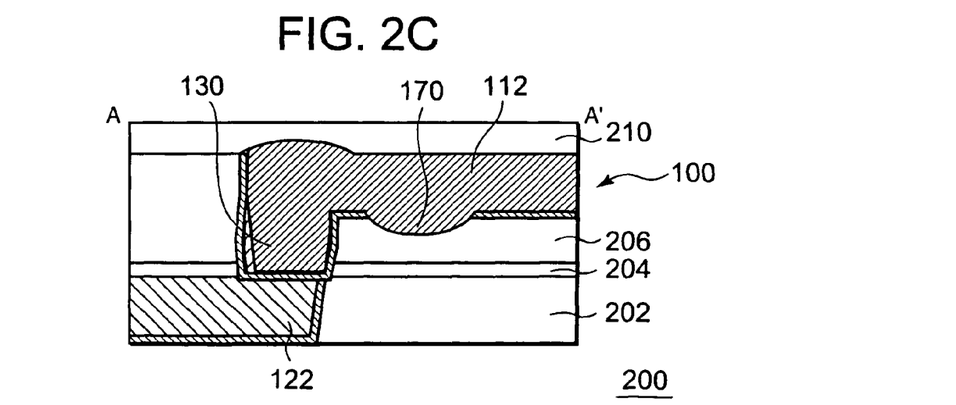

As illustrated in FIGS. 2A to 2C, in this embodiment, the semiconductor device 200 has a structure in which an interlayer insulating film 202, an etching stopper film 204, an interlayer insulating film 206, and an interlayer insulating film 210 are laminated on the substrate (not shown) in the stated order. FIG. 2A illustrates a state before the disconnection.

It should be noted that all layers are not necessarily illustrated in FIGS. 2A to 2C and that a protective film or an etching stopper film may be formed between the respective layers as appropriate. Further, the via 130 and the upper layer fuse interconnect 112 may be formed in layers of different interlayer insulating films. The interlayer insulating film may be formed of, for example, a low dielectric constant film such as a silicon oxycarbide (SiOC) film.

The lower layer fuse interconnect 122 is formed in the interlayer insulating film 202. The via 130 is formed in the etching stopper film 204 and the interlayer insulating film 206. The upper layer fuse interconnect 112 is formed in the interlayer insulating film 206. Further, the via 130 and the upper layer fuse interconnect 112 may be formed by a dual damascene process or a single damascene process.

The upper layer terminal 114, the upper layer fuse interconnect 112, the via 130, the lower layer fuse interconnect 122, and the lower layer terminal 124 may each be formed of a copper-containing metal film 140. Further, a barrier metal film 142 may be formed on a side surface and a bottom surface of the copper-containing metal film 140 that forms each of the upper layer terminal 114, the upper layer fuse interconnect 112, the via 130, the lower layer fuse interconnect 122, and the lower layer terminal 124. The barrier metal film 142 may contain a refractory metal. The barrier metal film 142 may be formed of, for example, a tantalum (Ta) film, a tantalum nitride (TaN) film, a titanium (Ti) film, a titanium nitride (TiN) film, a tungsten (W) film, a tungsten nitride (WN) film, or the like.

In other words, in the state before the disconnection, the barrier metal film 142 is formed between the lower layer fuse interconnect 122 and the via 130 in contact with the copper-containing metal film 140 that forms each of the lower layer fuse interconnect 122 and the via 130.

In the electric fuse 100 having the above-mentioned structure, a voltage is applied between the upper layer terminal 114 and the lower layer terminal 124 to apply an appropriate power to the electric fuse 100. Though not particularly limited, for example, a high voltage (Vdd) is applied to the lower layer terminal 124, and the upper layer terminal 114 is grounded, to thereby apply an appropriate power to the electric fuse 100. As a result, a current is caused to flow in a direction from the lower layer fuse interconnect 122 to the upper layer fuse interconnect 112 (FIG. 2A). Accordingly, the conductive material that forms the electric fuse 100 is heated and expands. In this case, the temperature is more likely to be higher at the point located farther from the upper layer terminal 114 and the lower layer terminal 124 that may function as the heat sink. Further, in this embodiment, the upper layer fuse interconnect 112 includes the width varying region 118, and hence the temperature is more likely to be higher at the narrow portion 112a having the small interconnect width. The volume of the conductive material greatly increases at the point at which the temperature becomes higher. Accordingly, a crack easily occurs in the insulating film located around the width varying region 118, which causes the overflow of the conductive material.

In this embodiment, the conductive material, which forms each of the via 130 and the upper layer fuse interconnect 112, expands at the position located far from the upper layer terminal 114 and the lower layer terminal 124. With regard to the via 30, a via diameter thereof expands to be larger than an original via diameter thereof. Further, in an upper part of the upper layer fuse interconnect 112, silicon or carbon that is contained in the interlayer insulating film 210 is brought into contact with the conductive material having a high temperature to be taken into the conductive material (FIG. 2B). After that, when the expansion of the upper layer fuse interconnect 112 advances to a certain degree, a crack occurs in the interlayer insulating film 206 located around the upper layer fuse interconnect 112 having a large volume. As a result, the conductive material overflows into the interlayer insulating film 206, to thereby form an overflow portion 170 (FIG. 2C).

Figure 3A:
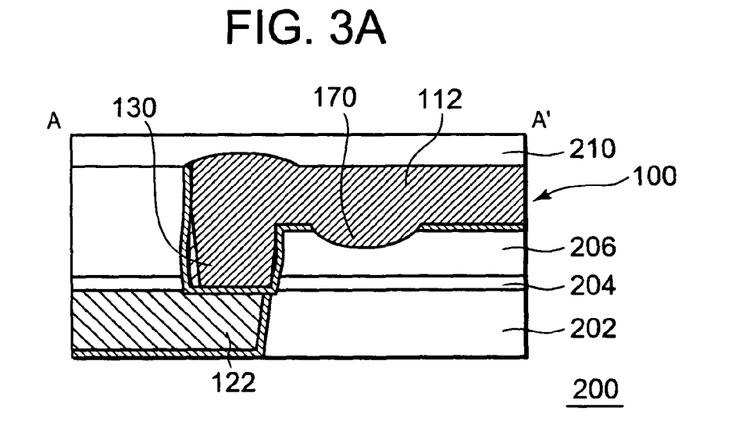
FIGS. 3A to 3C are cross sectional views taken along the line A-A' of FIG. 1.
Figure 3B:
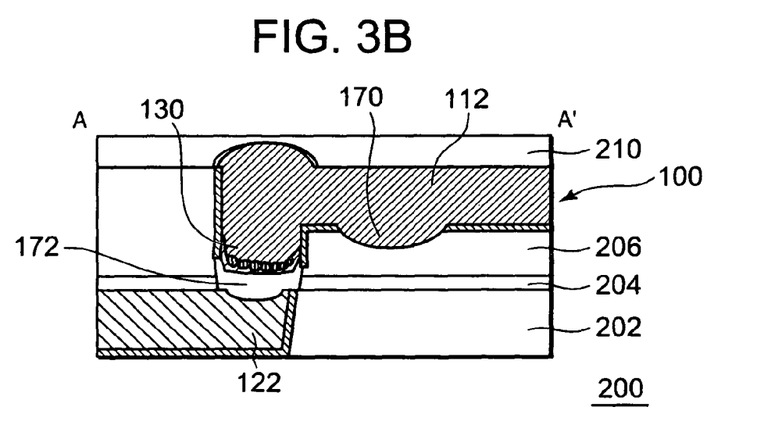
Figure 3C:
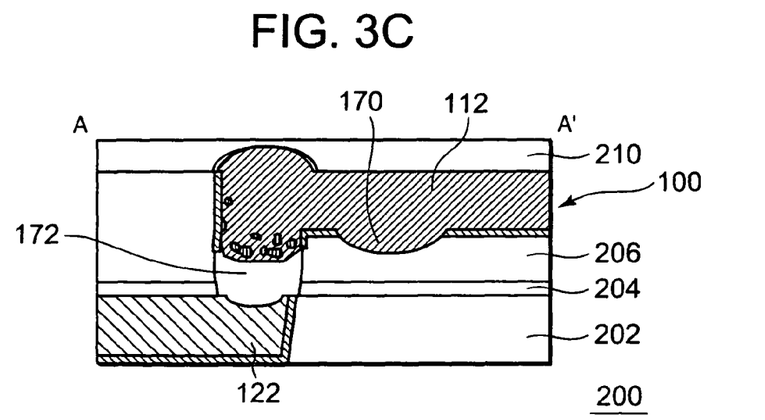

After that, the conductive material is melted with a lapse of time to increase a resistance thereof. As a result, heat supply reduces, and the conductive material starts to solidify (FIG. 3A). In this case, the conductive material thermally contracts, and moves such that a surface area thereof becomes smaller due to a surface tension. Then, a void is formed in the via 130 to become a disconnection point 172 (FIG. 3B). After that, the conductive material continues to thermally contract until the temperature thereof reaches room temperature, and then solidifies while leaving the disconnection point 172 between the via 130 and the lower layer fuse interconnect 122 (FIG. 3C).

In this embodiment, the upper layer fuse interconnect 112 and the lower layer fuse interconnect 122 may be formed so as not to overlap each other in plan view except for a region connected to the via 130. Accordingly, when the overflow portion 170 is formed, the upper layer fuse interconnect 112 and the lower layer fuse interconnect 122 may be prevented from being connected to each other through the overflow portion 170. It should be noted that, for a reliable connection to the via 130, the upper layer fuse interconnect 112 and the lower layer fuse interconnect 122 are formed wider than the via diameter of the via 130 in plan view, and formed so as to extend from the via 130 in an eaves-like shape. Here, "the region connected to the via 130" includes such a region as described above.

Further, in this embodiment, the barrier metal film 142 is formed between the via 130 and the lower layer fuse interconnect 122. Therefore, the barrier metal film 142 is easily separated from the lower layer fuse interconnect 122, and the disconnection point 172 is easily formed between the barrier metal film 142 and the lower layer fuse interconnect 122. In addition, in the disconnection state, the conductive material that forms the via 130 moves along with the barrier metal film 142, with the result that the disconnection point 172 is formed between the barrier metal film 142 and the lower layer fuse interconnect 122. Therefore, it may be prevented that the conductive materials including the barrier metal film and the copper-containing metal film coagulate and then deform due to thermal history thereof in the following assembly process or the like or in actual use under high temperature so that the lower layer fuse interconnect 122 and the via 130 are connected to each other again. Accordingly, heat resistance of the semiconductor device 200 may be enhanced.

The electric fuse 100 is disconnected by the crack assist type method having the mechanism as described above. As a natural result, the disconnection point 172 is formed in a region different from a region in which the overflow portion 170 is formed. Accordingly, the reconnection of the electric fuse 100 may be prevented.

Next, an effect of the semiconductor device 200 of this embodiment is described.

Figure 4A:
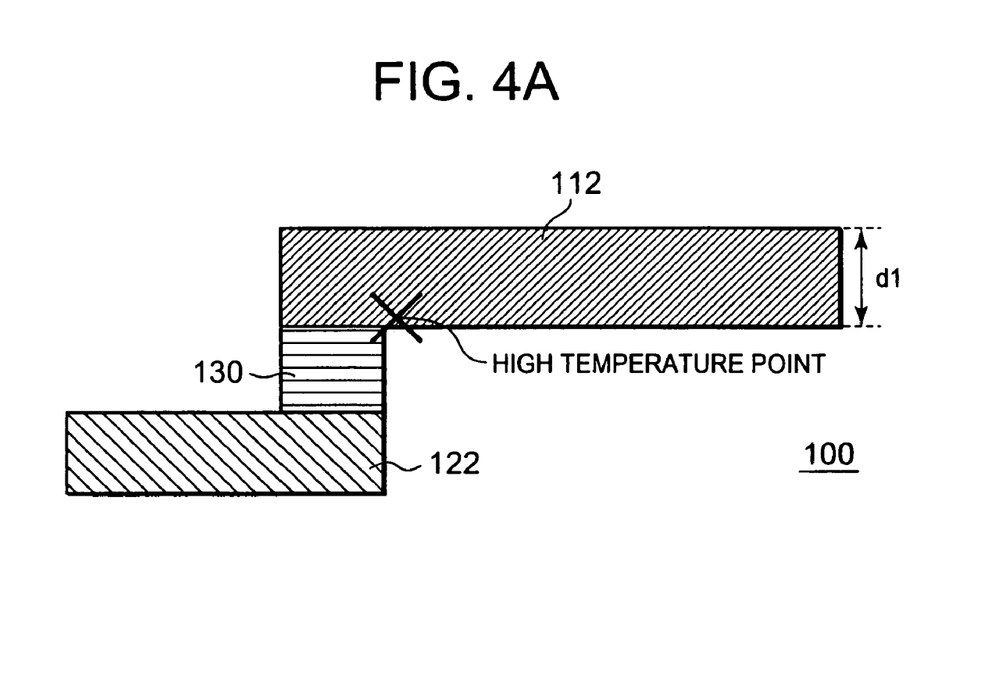
FIGS. 4A and 4B are views for describing an effect of the semiconductor device according to the embodiment of the present invention.
Figure 4B:
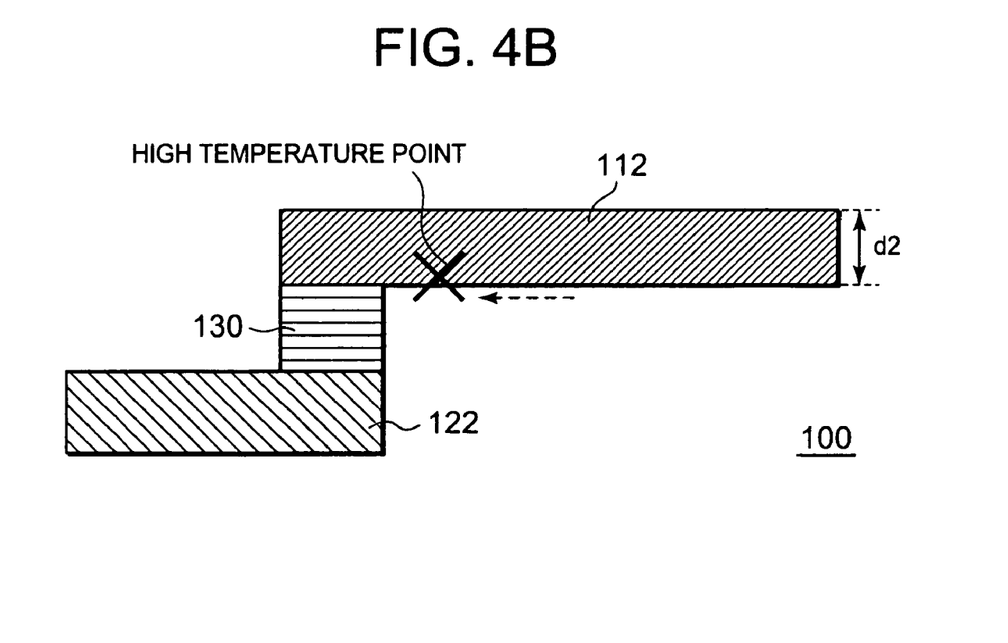

In this embodiment, the upper layer fuse interconnect 112 includes the width varying region 118. Therefore, the point at which the temperature becomes higher in the upper layer fuse interconnect 112 may be controlled to be the narrow portion 112a of the width varying region 118. Accordingly, for example, as described above with reference to FIGS. 9A and 9B, even in a case where a film thickness of the upper layer fuse interconnect 112 becomes thinner, that is, becomes not a design value d1 of FIG. 4A but a value d2 of FIG. 4B (d1>d2) due to the manufacturing fluctuations, the point at which the temperature becomes higher may be controlled to a certain degree. As a result, as illustrated in FIG. 4B, the point at which the temperature becomes higher (high temperature point) may be set to a position closer to the via 130 than the position illustrated in FIG. 9B. Accordingly, there may be obtained the electric fuse that is stably disconnected at the via 130 irrespective of the manufacturing fluctuations.

OTHER EXAMPLES

In this embodiment, the width varying region 118 of the upper layer fuse interconnect 112 may have various structures as long as the temperature becomes higher in the vicinity of the connection point of the upper layer fuse interconnect 112 with the via 130 when a voltage is applied to the electric fuse 100. Hereinafter, other examples of the structure of the upper layer fuse interconnect 112 according to this embodiment are described.

Figure 5A:
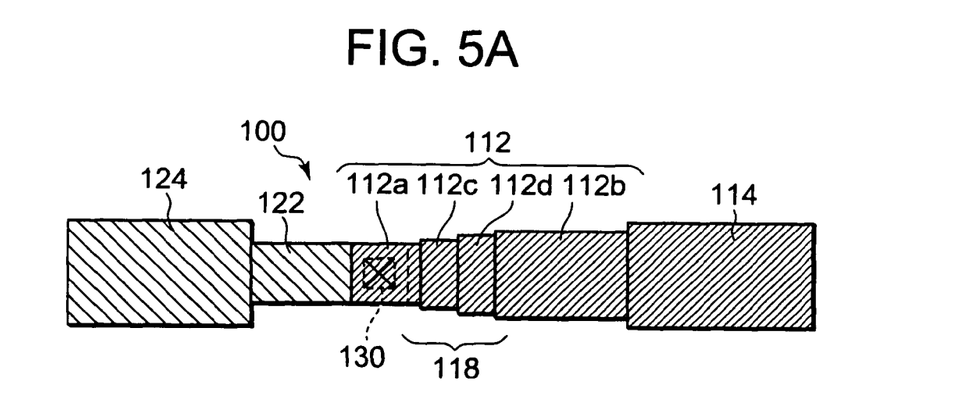
FIGS. 5A to 5C are plan views illustrating other examples of the structure of the electric fuse according to the embodiment of the present invention.

For example, as illustrated in FIG. 5A, the upper layer fuse interconnect 112 may have a structure in which a connection portion 112c and a connection portion 112d having interconnect widths different from each other are formed between the narrow portion 112a and the wide portion 112b. Here, the narrow portion 112a, the connection portion 112c, the connection portion 112d, and the wide portion 112b are formed between the via 130 and the upper layer terminal 114 in the stated order. The interconnect width becomes wider in the order of the narrow portion 112a, the connection portion 112c, the connection portion 112d, and the wide portion 112b. In this structure, the narrow portion 112a is formed so as to have the smallest interconnect width. Also with the above-mentioned structure, when the electric fuse 100 is disconnected, the temperature may be set to be the highest at the narrow portion 112a in the upper layer fuse interconnect 112, which makes higher the temperature of the via 130. As a result, the disconnection point 172 may be formed in the via 130.

Figure 5B:
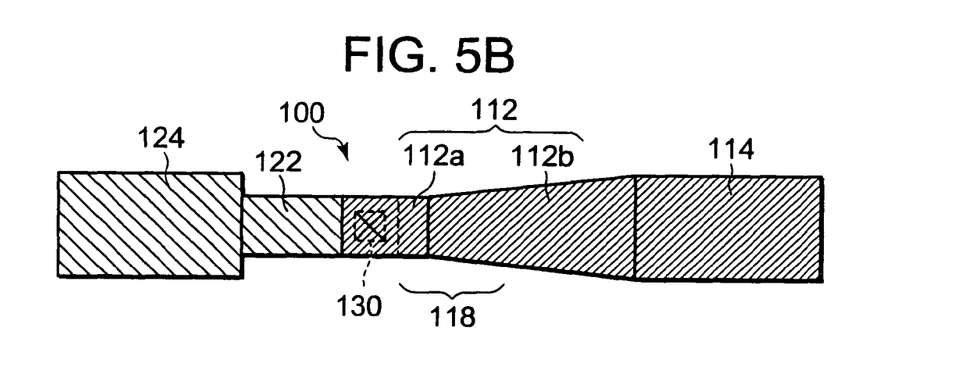

Alternatively, for example, as illustrated in FIG. 5B, the wide portion 112b of the upper layer fuse interconnect 112 may have an inclined structure in which the interconnect width thereof becomes gradually smaller from the connection point with the upper layer terminal 114 toward the connection point with the narrow portion 112a. Also with the above-mentioned structure, when the electric fuse 100 is disconnected, the temperature may be set to be the highest at the narrow portion 112a in the upper layer fuse interconnect 112, which makes higher the temperature of the via 130. As a result, the disconnection point 172 may be formed in the via 130.

Figure 5C:
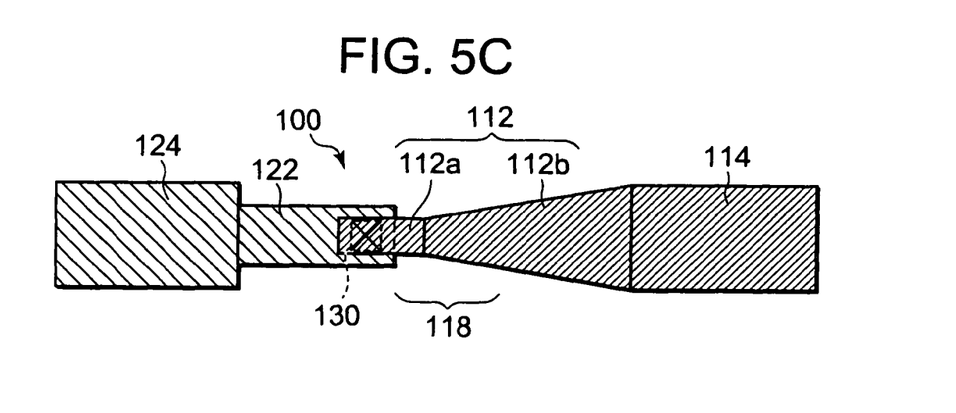

Further, for example, as a modified example of the structure illustrated in FIG. 5B, as illustrated in FIG. 5C, the interconnect width of the narrow portion 112a of the upper layer fuse interconnect 112 may be smaller than the interconnect width of the lower layer fuse interconnect 122. Similarly in this case, the total volume of the upper layer fuse interconnect 112 may be larger than the total volume of the lower layer fuse interconnect 122 in order to form the overflow portion 170 in the upper layer fuse interconnect 112. Also with the above-mentioned structure, when the electric fuse 100 is disconnected, the temperature may be set to be the highest at the narrow portion 112a in the upper layer fuse interconnect 112, which makes higher the temperature of the via 130. As a result, the disconnection point 172 may be formed in the via 130.

Figure 6A:
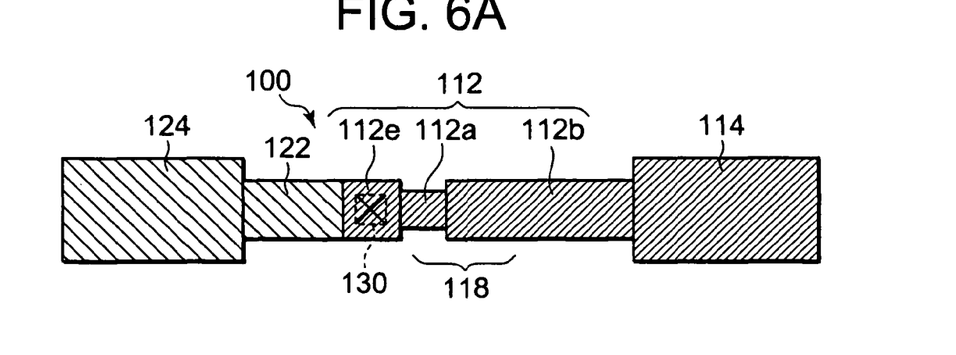
FIGS. 6A to 6C are plan views illustrating further examples of the structure of the electric fuse according to the embodiment of the present invention.

Still alternatively, for example, as illustrated in FIG. 6A, in the upper layer fuse interconnect 112, an interconnect width of a connection portion 112e formed directly above the via 130 may be larger than that of the narrow portion 112a. With this structure, the connection between the via 130 and the lower layer fuse interconnect 122 maybe excellent. In addition, the narrow portion 112a having the small interconnect width is formed in the vicinity of the connection point with the via 130, and hence when the electric fuse 100 is disconnected, the temperature may be set to be the highest at the narrow portion 112a in the upper layer fuse interconnect 112, which makes higher the temperature of the via 130. As a result, the disconnection point 172 may be formed in the via 130.

Figure 6B:
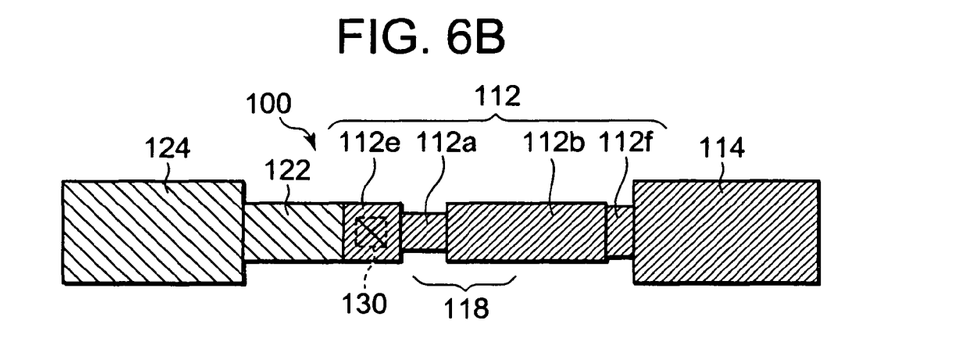

Further, for example, as a modified example of the structure illustrated in FIG. 6A, as illustrated in FIG. 6B, a connection portion 112f having an interconnect width smaller than that of the wide portion 112b may be formed between the upper layer terminal 114 and the wide portion 112b. Similarly in this structure, the narrow portion 112a is formed so as to have the smallest interconnect width. Also with the above-mentioned structure, when the electric fuse 100 is disconnected, the temperature may be set to be the highest at the narrow portion 112a in the upper layer fuse interconnect 112, which makes higher the temperature of the via 130. As a result, the disconnection point 172 may be formed in the via 130.

Figure 6C:
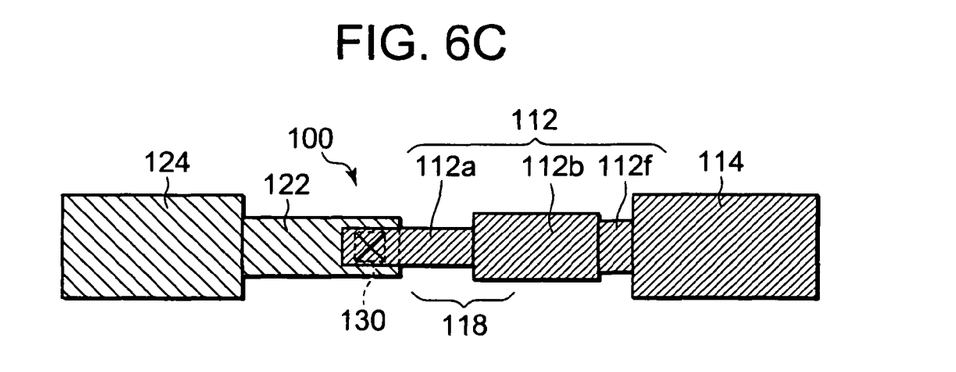

Further, for example, as a modified example of the structure illustrated in FIG. 6B, as illustrated in FIG. 6C, the interconnect width of the narrow portion 112a of the upper layer fuse interconnect 112 maybe smaller than the interconnect width of the lower layer fuse interconnect 122. Similarly in this case, the total volume of the upper layer fuse interconnect 112 may be larger than the total volume of the lower layer fuse interconnect 122 in order to form the overflow portion 170 in the upper layer fuse interconnect 112. Also with the above-mentioned structure, when the electric fuse 100 is disconnected, the temperature may be set to be the highest at the narrow portion 112a in the upper layer fuse interconnect 112, which makes higher the temperature of the via 130. As a result, the disconnection point 172 may be formed in the via 130.

Hereinabove, the embodiment of the present invention is described with reference to the attached drawings. The above-mentioned structures are merely examples of the present invention, and thus various different structures may be adopted.

What is claimed is:

1. A semiconductor device, comprising:
    a substrate; and
    an electric fuse including:
        a first fuse interconnect formed over the substrate;
        a second fuse interconnect formed in a layer different from a layer in which the first fuse interconnect over the substrate is formed; and
        a via which is connected to one end of the first fuse interconnect and connects the first fuse interconnect and the second fuse interconnect,
    wherein the first fuse interconnect includes a gradual width varying region including a small interconnect width region on a side of the one end of the first fuse interconnect and a large interconnect width region on a side of an other end of the first fuse interconnect,
    wherein the layer in which the first fuse interconnect is formed is located above the layer in which the second fuse interconnect is formed,
    wherein the first fuse interconnect, the second fuse interconnect, and the via each comprise:
        a copper-containing metal film; and
        a barrier metal film which covers a side surface and a bottom surface of the copper-containing metal film,
    wherein before disconnection, the barrier metal film is formed between the second fuse interconnect and the via so as to be in contact with the copper-containing metal film which forms each of the second fuse interconnect and the via, and
    wherein, when a current flows through the first fuse interconnect, the current flows from the small interconnect width region to the large interconnect width region.

2. A semiconductor device according to claim 1, wherein the electric fuse is disconnected by an overflow portion which is formed when a conductive material forming the electric fuse overflows from the first fuse interconnect outwardly during disconnection.

3. A semiconductor device according to claim 2, wherein the electric fuse is disconnected to form a disconnection point at the via.

4. A semiconductor device according to claim 1, wherein an interconnect width of the gradual width varying region of the first fuse interconnect becomes smaller in a vicinity of a connection point with the via.

5. A semiconductor device according to claim 1, wherein the gradual width varying region further comprises a structure in which a portion of the first fuse interconnect having a smallest interconnect width is formed in a vicinity of a connection point with the via.

6. A semiconductor device according to claim 1, wherein the gradual width varying region is formed so that a temperature becomes higher in a vicinity of a connection point of the first fuse interconnect with the via when a voltage is applied to the electric fuse.

7. A semiconductor device according to claim 1, wherein the first fuse interconnect has a volume larger than a volume of the second fuse interconnect.

8. A semiconductor device according to claim 1, wherein the first fuse interconnect has a length longer than a length of the second fuse interconnect.

9. A semiconductor device according to claim 1, wherein the first fuse interconnect and the second fuse interconnect are formed so as not to overlap each other in plan view except for a region connected to the via.

10. A semiconductor device, comprising:
a substrate;
a first fuse interconnect formed over the substrate;
a second fuse interconnect formed in a layer different from a layer in which the first fuse interconnect over the substrate is formed; and
a via which is connected to an one end of the first fuse interconnect,
wherein a width of the first fuse interconnect decreases gradually as the first fuse interconnect approaches the via,
wherein the via connects the first fuse interconnect and the second fuse interconnect,
wherein the layer in which the first fuse interconnect is formed is located above the layer in which the second fuse interconnect is formed,
wherein the first fuse interconnect, the second fuse interconnect, and the via each comprise:
a metal film which includes copper; and
a barrier metal film which covers a side surface and a bottom surface of the metal film,
wherein before disconnection, the barrier metal film is formed between the second fuse interconnect and the via so as to be in contact with the metal film which forms the second fuse interconnect and the via, and
wherein, when a current flows through the first fuse interconnect, the current flows from a narrow region of the first fuse interconnect toward a wide region of the first fuse interconnect.

11. A semiconductor device according to claim 10, wherein a part of the width of the first fuse interconnect decreases gradually as the first fuse interconnect approaches the via.

12. A semiconductor device according to claim 11, wherein the first fuse interconnect is disconnected by an overflow portion, which is formed when a conductive material forming the fuse interconnect overflows from the first fuse interconnect outwardly during disconnection.

13. A semiconductor device according to claim 10, wherein the first fuse interconnect and the second fuse interconnect are formed so as not to overlap each other in plan view except for a region connected to the via.

14. A semiconductor device according to claim 11, wherein the first interconnect further comprises a metal film which includes copper.

15. The semiconductor device according to claim 1, wherein the gradual width varying region further comprises a plurality of progressively narrower portions, with a narrowest portion at an end of the gradual width varying region.

16. The semiconductor device according to claim 1, wherein the gradual width varying region further comprises an incline with a narrowest portion at the one end of the gradual width varying region.

* * * * *